(12) United States Patent
Chae et al.

(10) Patent No.: US 7,944,747 B2
(45) Date of Patent: May 17, 2011

(54) FLASH MEMORY DEVICE AND METHOD FOR PROGRAMMING FLASH MEMORY DEVICE HAVING LEAKAGE BIT LINES

(75) Inventors: Dong-Hyuk Chae, Seoul (KR); Young-Ho Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 145 days.

(21) Appl. No.: 12/400,123

(22) Filed: Mar. 9, 2009

(65) Prior Publication Data

US 2009/0231917 A1  Sep. 17, 2009

(30) Foreign Application Priority Data

Mar. 17, 2008  (KR) .................... 200824526
Mar. 17, 2008  (KR) .................... 200824530

(51) Int. Cl.
*G11C 16/06* (2006.01)
(52) U.S. Cl. ......... 365/185.09; 365/185.05; 365/185.11; 365/195
(58) Field of Classification Search ............. 365/185.09, 365/185.11, 185.05, 185.18, 195
See application file for complete search history.

(56) References Cited

U.S. PATENT DOCUMENTS

| 5,297,029 | A | 3/1994 | Nakai et al. |
| 6,288,940 | B1 | 9/2001 | Kawamura |
| 6,522,583 | B2 * | 2/2003 | Kanda et al. ............. 365/185.17 |
| 6,813,183 | B2 | 11/2004 | Chevallier |
| 7,023,734 | B2 * | 4/2006 | Chen ......................... 365/185.19 |
| 7,489,560 | B2 * | 2/2009 | Chang et al. ............. 365/185.28 |
| 7,724,594 | B2 * | 5/2010 | Xi et al. ......................... 365/203 |
| 2001/0040836 | A1 * | 11/2001 | Mori et al. ..................... 365/240 |
| 2004/0130960 | A1 * | 7/2004 | Houston et al. ............... 365/229 |

FOREIGN PATENT DOCUMENTS

| JP | 05274891 | 10/1993 |
| JP | 05282882 | 10/1993 |
| JP | 2001195892 | 7/2001 |
| KR | 1019930014577 | 7/1993 |
| KR | 1020010069211 | 7/2001 |
| KR | 1020030009288 | 1/2003 |
| KR | 1020030017884 | 3/2003 |

* cited by examiner

*Primary Examiner* — Pho M Luu
(74) *Attorney, Agent, or Firm* — Volentine & Whitt, P.L.L.C.

(57) ABSTRACT

Provided is a method for programming a flash memory device. The method includes receiving writing data, detecting leakage bit lines of the flash memory device, and updating the received writing data in order for data corresponding to the leakage bit lines to be modified as program-inhibit data. A programming operation is performed on the flash memory device after updating the writing data.

18 Claims, 13 Drawing Sheets

FLASH MEMORY DEVICE AND METHOD FOR PROGRAMMING FLASH MEMORY DEVICE HAVING LEAKAGE BIT LINES

PRIORITY CLAIM

A claim of priority under 35 U.S.C. §119 is made to Korean Patent Application No. 10-2008-0024526, filed Mar. 17, 2008, and Korean Patent Application No. 10-2008-0024530, filed Mar. 17, 2008, the entire contents of both of which are hereby incorporated by reference.

SUMMARY

The present invention disclosed herein relates to a semiconductor memory device, and more particularly, to a memory system including a flash memory device and a memory controller and a method for operating the same.

A semiconductor memory device is a storage device that stores data and provides read out the data. A semiconductor memory device can be random access memory (RAM) or read only memory (ROM). RAM is volatile memory which loses stored data when power is interrupted. ROM is nonvolatile memory which retains stored data, even when power is interrupted. RAM includes a dynamic RAM (DRAM) and static RAM (SRAM), for example. ROM includes programmable ROM (PROM), erasable PROM (EPROM), electrically erasable PROM (EEPROM) and flash memory, for example. Flash memory may be NOR flash memory or NAND flash memory. NAND flash memory has a higher degree of integration than NOR flash memory. Flash memory includes a memory cell array for storing data. The memory cell array includes multiple memory blocks, each of which includes multiple pages, and each of the pages includes memory cells. Flash memory performs erase operations in memory block units, and performs read and write operation in page units.

During test operations, a test voltage is applied to a selected word line, and bit lines are precharged to a preset voltage level. At this point, the bit lines are floated. Each programmed memory cell has a threshold voltage higher than the test voltage. When the test voltage is applied to a word line, the programmed memory cells are turned off. Accordingly, the bit lines connected to the programmed memory cells can maintain a precharged voltage level.

Each non-programmed memory cell has a threshold voltage lower than the test voltage. When the test voltage is applied to a word line, the non-programmed memory cells are turned on. That is, the non-programmed bit lines are electrically connected to a common source line. Accordingly, the voltage level of the bit lines connected to the non-programmed memory cells become lower than the precharged voltage level.

When a flash memory deteriorates, a leakage bit line may result. A leakage bit line is a bit line which becomes connected to an adjacent bit line and/or another portion of the memory cell array. Therefore, during test operations, although a memory cell connected to the leakage bit line is a programmed memory cell, current may leak from the leakage bit line. Accordingly, the programmed memory cell connected to the leakage bit line may be inaccurately determined to be a non-programmed memory cell.

Also, although the programming of memory cells connected to the leakage bit line ends, it may be inaccurately determined that the programming of memory cells connected to the leakage bit line continues. Accordingly, a memory block, which corresponds to a page where a program fail occurs and a programming operation is performed, may be processed as an invalid memory block. When memory blocks of the flash memory are connected in common to the same bit lines, a system fail of the flash memory may likewise occur.

Embodiments of the present invention provide a memory system and a method of programming a memory system which prevent invalid memory blocks from occurring due to formation of leakage bit lines.

Embodiments of the present invention provide a method for programming a flash memory device. The method includes receiving writing data; detecting leakage bit lines of the flash memory device; updating the received writing data in order for data corresponding to the leakage bit lines to be modified as program-inhibit data; and performing a programming operation on the flash memory device after updating the writing data.

Detecting the leakage bit lines may include applying a ground voltage to a string selection line of the flash memory device, applying a bit line voltage to bit lines of the flash memory device, and floating the bit lines. Also, receiving the writing data and detecting the leakage bit lines may be started simultaneously.

The method may further include receiving writing data to be programmed in a succeeding cycle, wherein performing the programming operation and receiving the writing data to be programmed in the succeeding cycle may be started simultaneously.

Updating the received writing data may include determining whether a number of the detected leakage bit lines is greater than a number of bits correctable by an error correcting operation. When the number of the detected leakage bit lines is greater than the number of bits correctable by the error correcting operation, memory blocks connected to the detected leakage bit lines are identified as invalid memory blocks.

The method may further include identifying a memory block, corresponding to a page in which a program fail occurs, as an invalid memory block when the program fail occurs in the programming operation.

Additional embodiments of the present invention provide a method for operating a memory system including a flash memory device and a memory controller. The method includes receiving writing data, and updating the received writing data so that data of the received writing data corresponding to leakage bit lines are modified as program-inhibit data, the leakage bit lines being identified by previously stored leakage bit line information. A programming operation is performed on the flash memory device using the updated received writing data.

The stored leakage bit line information may be stored in a mapping table of the memory controller.

The method may further include detecting leakage bit lines of a memory cell array when a program fail occurs during the programming operation. Detecting the leakage bit lines may include applying a ground voltage to a string selection line of the flash memory device, applying a bit line voltage to bit lines of the flash memory device, and floating the bit lines.

The method may further include comparing the detected leakage bit lines with the leakage bit lines identified by the stored leakage bit line information. A memory block, corresponding to a page in which the writing data are to be programmed, may be identified as an invalid memory block when the detected leakage bit lines are the same as the leakage bit lines identified by the stored leakage bit line information. Also, the stored leakage bit line information may be updated based on the detected leakage bit lines when the detected leakage bit lines differ from the leakage bit lines identified by the stored leakage bit line information.

The method may further include determining whether a number of the detected leakage bit lines is greater than a number of bits correctable by the memory controller. Memory blocks connected to the detected leakage bit lines may be identified as invalid memory blocks when the number of the detected leakage bit lines is greater than the number of bits correctable by the memory controller.

Additional embodiments of the present invention provide a system including a flash memory device having a memory cell array, and a memory controller configured to control the flash memory device. The flash memory device and the memory controller receive external writing data and program the writing data in the memory cell array. Data of the received writing data corresponding to leakage bit lines of the memory cell array are modified as program-inhibit data.

The flash memory device may further include a bit line leakage controller for modifying the data corresponding to the leakage bit lines of the memory cell array as program-inhibit data. The bit line leakage controller may also control an operation of detecting the leakage bit lines, the operation including applying a ground voltage to a string selection line of the memory cell array, applying a bit line voltage to bit lines of the memory cell array, and floating the bit lines to identify the leakage bit lines.

The bit line leakage controller may determine whether a number of the detected leakage bit lines is greater than a number of bits correctable by an error correcting operation, and identify memory blocks connected to the detected leakage bit lines as invalid memory blocks when the number of the detected leakage bit lines is greater than the number of the bits correctable by the error correcting operation.

The flash memory device may further include a page buffer and a cache. The bit line leakage controller may start the operation of detecting the leakage bit lines using the page buffer when the writing data are loaded into the cache.

The bit line leakage controller may update the writing data in order for the data corresponding to the leakage bit lines of the memory cell array to be modified as the program-inhibit data when loading the writing data ends and the operation of detecting of the leakage bit lines ends.

The memory controller may include a bit line leakage controller for updating the writing data in order for the data corresponding to the leakage bit lines of the memory cell array to be modified as program-inhibit data during a programming operation; and a mapping table for storing leakage bit line information representing the leakage bit lines.

The memory controller may further include a data buffer for storing data to be transferred to the flash memory device. The bit line leakage controller may update the writing data in order for the data corresponding to the leakage bit lines, represented by the leakage bit line information, to be modified as the program-inhibit data using the leakage bit line information when the writing data are transferred to the data buffer.

BRIEF DESCRIPTION OF THE FIGURES

The attached drawings illustrate exemplary and non-limiting embodiments of the present invention, in which.

DETAILED DESCRIPTION OF THE EMBODIMENTS

Figure 1:
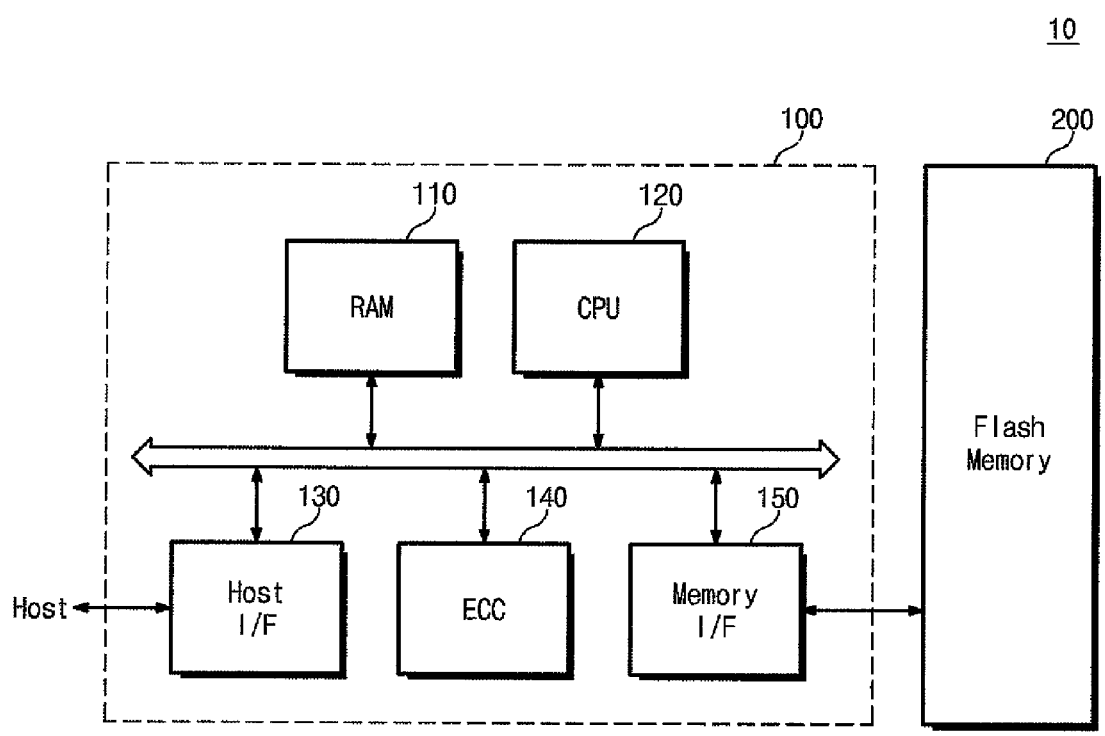
FIG. 1 is a block diagram of a memory system, according to an embodiment of the present invention.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and. techniques are not described with respect to some of the embodiments of the present invention. Throughout the drawings and written description, like reference numerals will be used to refer to like or similar elements.

For convenience, embodiments of the present invention will be described referring to a memory system that includes a NAND flash memory device. However, it will be understood that the flash memory device, and methods for programming the same, according to embodiments of the present invention, are not limited to NAND flash memory devices.

Methods for programming a flash memory device, according to embodiments of the present invention, include receiving writing data, detecting leakage bit lines of the flash memory device, updating the received writing data in order for writing data corresponding to the leakage bit lines to be modified as program-inhibit data, and performing a programming operation on the flash memory device using the updated received writing data.

Methods for operating a memory system including a flash memory device and a memory controller, according to embodiments of the present invention, include receiving writing data, updating the received writing data in order for data among the received writing data corresponding to leakage bit lines, identified by stored leakage bit line information, to be modified as program-inhibit data, and performing a programming operation on the flash memory device using the updated received writing data.

Memory systems according to embodiments of the present invention include a flash memory device having a memory cell array, and a memory controller controlling the flash memory device. The flash memory device and the memory controller receive external writing data and write the received writing data in the memory cell array. Data of the received writing data corresponding to leakage bit lines of the memory cell array are modified as program-inhibit data.

Hereinafter, illustrative embodiments of the present invention will be described in detail with reference to the accompanying drawings.

FIG. 1 is a block diagram of a memory system 10, according to an illustrative embodiment of the present invention. Referring to FIG. 1, the memory system 10 includes a memory controller 100 and a flash memory device 200.

The memory controller 100 is connected to a host and the flash memory device 200. The memory controller 100 transfers data read from the flash memory device 200 to the host and/or stores data transferred from the host in the flash memory device 200. The flash memory device 200 will be described in more detail with reference to FIG. 2, below.

The memory controller 100 includes random access memory (RAM) 110, processing unit 120, host interface 130, error correcting circuit 140, and memory interface 150. RAM 110 may be used as the operational memory of the processing unit 120, for example. The processing unit 120 may be a central processing unit (CPU), and controls operations of the memory controller 100. The host interface 130 enables data to be exchanged between the host and the memory controller 100, according to an appropriate protocol. The memory controller 100 may be configured to communicate with an external device (host), via the host interface 130, through any one of various interface protocols, such as a universal serial bus (USB) interface, a multi-media card (MMC) interface, a PCI express (PCI-E) interface, an advanced technology attachment (ATA) interface, Serial-ATA interface, a parallel-ATA interface, a small computer system interface (SCSI), an enhanced small device interface (ESDI) or an integrated drive electronics (IDE) interface, for example.

The error correcting circuit 140 detects and corrects errors of the data read from the flash memory device 200. The memory interface 150 interfaces with the flash memory device 200. Since the various elements of the memory controller 100 are known, general descriptions will be omitted.

Figure 2:
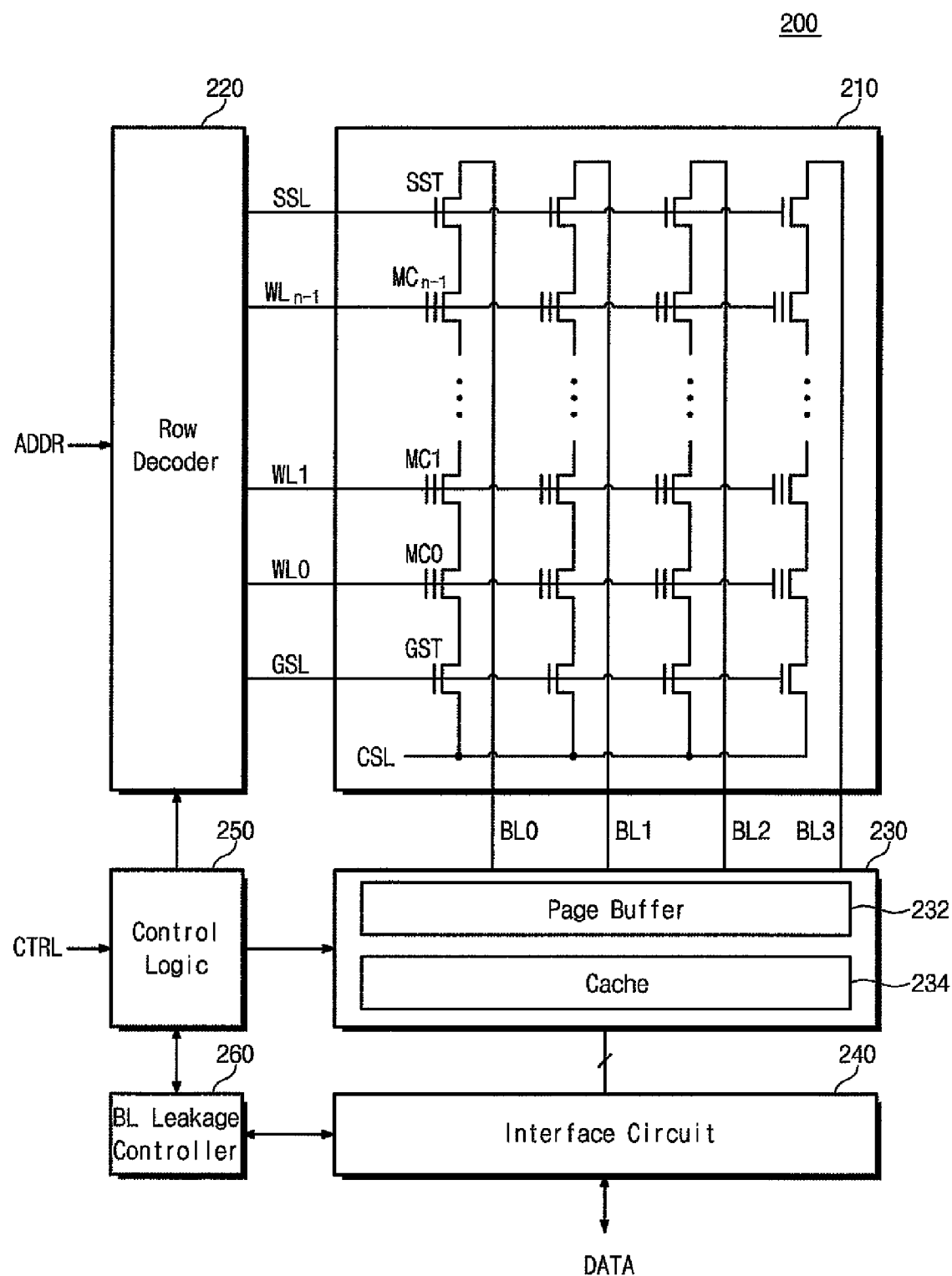
FIG. 2 is a block diagram of a flash memory device of FIG. 1, according to an embodiment of the present invention.

FIG. 2 is a block diagram of the flash memory device 200 of FIG. 1, according to an illustrative embodiment of the invention. Referring to FIG. 2, the flash memory device 200 includes memory cell array 210, row decoder 220, page buffer unit 230, interface circuit 240, control logic 250, and bit line leakage controller 260.

The memory cell array 210 includes multiple memory blocks, although FIG. 2 illustrates only one representative memory block for purposes of description. Each memory block includes multiple bit lines, such as 1024 bit lines or 2048 bit lines, for example. For convenience of explanation, FIG. 2 shows only four representative bit lines BL0 to BL3 to indicate the multiple bit lines.

The bit lines BL0 to BL3 extend from the memory block, and may be connected in common to multiple memory blocks. For example, all the memory blocks of the memory cell array 210 may be connected to the bit lines BL0 to BL3.

A string selection transistor SST, memory cells MC0 to $MC_{n-1}$ and a ground selection transistor GST are connected between each bit line BL0 to BL3 and common source line CSL. The gate of the string selection transistor SST is connected to the row decoder 220 through string selection line SSL. The gates of the memory cells MC0 to $MC_{n-1}$, are connected to the row decoder 220 through corresponding word lines WL0 to $WL_{n-1}$. The gate of the ground selection transistor GST is connected to the row decoder 220 through ground selection line GSL. Each set of memory cells MC connected to one word line WL constitute one page.

The row decoder 220 is connected to the memory cell array 210 and the control logic 250. The row decoder 220 receives an address ADDR, and selects word lines WL0 to $WL_{n-1}$ of the memory cell array 210 under control of the control logic 250. The address ADDR transferred to the row decoder 220 may be provided by the memory controller 100 of FIG. 1, for example.

The page buffer unit 230 is connected to the memory cell array 210, the interface circuit 240 and the control logic 250. The page buffer unit 230 reads data stored in the memory cell array 210 or stores data to be written in the memory cell array 210, under control of the control logic 250. The page buffer unit 230 also exchanges data with the interface circuit 240 under control of the control logic 250.

The page buffer unit 230 includes page buffer 232 and cache 234. In an embodiment the page buffer 232 and the cache 234 include multiple latches, respectively. The latches of the page buffer 232 and/or the latches of the cache 234 may be connected to corresponding bit lines BL0 to BL3, under control of the control logic 250. The latches of the page buffer 232 and/or the latches of the cache 234 also may be connected to the interface circuit 240, under control of the control logic 250.

The page buffer unit 230 may be controlled by the bit line leakage controller 260 through the control logic 250. For convenience of explanation, the page buffer unit 230 will be described as being controlled by the bit line leakage controller 260, even though the page buffer unit 230 may be controlled by the bit line leakage controller 260 through the control logic 250.

The latches of the cache 234, which correspond to the latches of the page buffer 232 storing "0," may be modified to store program-inhibit data "1" under control of the bit line leakage controller 260. Likewise, it will be understood that the latches of the page buffer 232, which correspond to the latches of the cache 234 storing "0," may be modified to store program-inhibit data "1" under the control of the bit line leakage controller 260.

The interface circuit 240 selects the bit lines BL0 to BL3, and may exchange data with the page buffer unit 230 corresponding to the selected bit line. The interface circuit 240 may be connected to the memory controller 100 of FIG. 1, for example, and thus may exchange data with the memory controller 100. The interface circuit 240 may include a column selector and a data input/output circuit (not shown).

The control logic 250 is connected to the row decoder 220, the page buffer unit 230 and the bit line leakage controller 260. The control logic 250 controls operation of the flash memory device 200 in accordance with control signal CTRL. The control signal CTRL may be provided from the memory controller 100 of FIG. 1, for example. The control logic 250 detects leakage bit lines of the bit lines BL0 to BL3 under the control of the bit line leakage controller 260. The control logic 250 controls the page buffer unit 230 so that the latches of the cache 234, which correspond to the latches of the page buffer 232 storing "0," store program-inhibit data "1" under control of the bit line leakage controller 260.

The bit line leakage controller 260 is connected to the interface circuit 240 and the control logic 250. The bit line leakage controller 260 detects leakage bit lines of the bit lines BL0 to BL3 by controlling the control logic 250. The bit line leakage controller 260 receives information about the leakage bit lines from the page buffer unit 230 through the interface circuit 240, for example. A method for detecting leakage bit lines will be described in more detail with reference to FIG. 4.

In an embodiment, the bit line leakage controller 260 stores the number of error bits correctable by the error correcting circuit 140 of the memory controller 100 of FIG. 1. The bit line leakage controller 260 is therefore able to compare the number of detected leakage bit lines with the number of error bits correctable by the error correcting circuit 140. When the number of detected leakage bit lines is greater than the number of error bits correctable by the error correcting circuit 140, the bit line leakage controller 260 modifies memory blocks connected to the leakage bit lines as invalid memory blocks.

In FIG. 2, the bit line leakage controller 260 is depicted as a discrete block separate from the control logic 250. However, it will be understood that, in various embodiments, operations described as being performed by the bit line leakage controller 260 may be performed by the control logic 250.

Hereinafter, operation of the memory system 10, according to an illustrative embodiment of the present invention, will be described in more detail with reference to the accompanying drawings.

Figure 3:
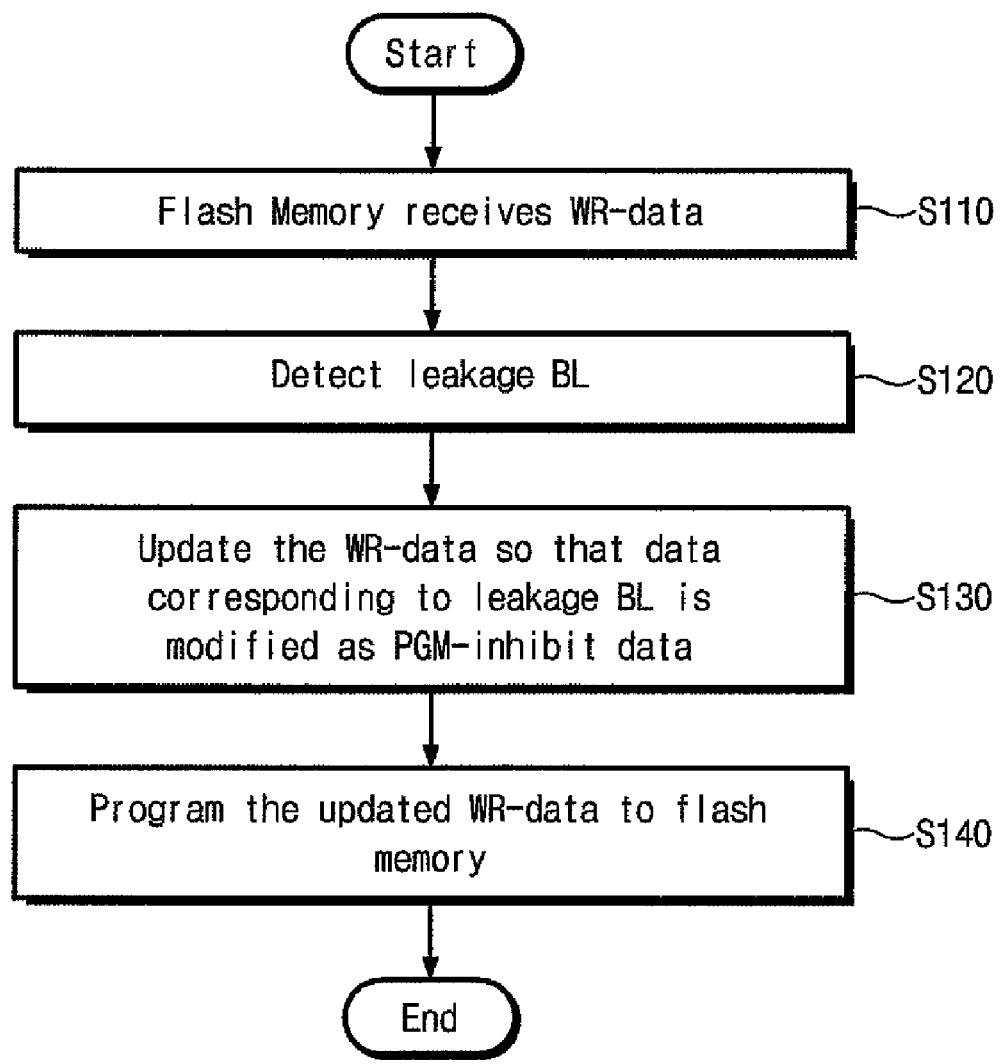
FIG. 3 is a flowchart illustrating a method for operating the memory system, according to an embodiment of the present invention.

FIG. 3 is a flowchart illustrating a method for operating the memory system 10, according to a representative embodiment of the present invention. Referring to FIGS. 1 to 3, in operation S110, the flash memory device 200 receives writing data WR-data. The writing data WR-data may be transferred to the flash memory device 200 from the host through the memory controller 100.

In operation S120, leakage bit lines of the flash memory device 200 are detected. A method for detecting the leakage bit lines of the flash memory device 200, according to an illustrative embodiment, will be described in more detail with reference to FIG. 4.

In operation S130, the writing data WR-data are updated so that data corresponding to the leakage bit lines detected in operation S120 are modified as program-inhibit data. For example, when data "0" is programming data and data "1" is program-inhibit data, all data of the writing data WR-data corresponding to the leakage bit lines are modified to program-inhibit data "1."

In operation S140, the updated writing data WR-data are programmed in the flash memory device 200. The programmed updated writing data WR-data includes the data corresponding to the leakage bit lines detected in operation S120, which has been modified to program-inhibit data "1."

When a memory cell connected to the leakage bit line is programmed to programming data "0," a program loop is repeated until the flow of current does not occur in the leakage bit line during test operations. However, the flow of the current occurs in the leakage bit line due to leakage. Accordingly, although a preset program loop is completely performed, it may be determined that the programming of the memory cell connected to the leakage bit line has not ended, and a corresponding memory block may be processed as an invalid memory block. Further, when all the memory blocks of the flash memory device 200 use the bit lines in common, all the memory blocks of the flash memory device 200 may be processed as invalid memory blocks.

However, when the memory cell connected to the leakage bit line is programmed to program-inhibit data "1," the corresponding memory block is determined to be operating normally when the flow of current occurs in the leakage bit line during test operations. Accordingly, when the data corresponding to the leakage bit line are modified to be program-inhibit data "1," the memory blocks connected to the leakage bit line are not processed as invalid memory blocks due to the leakage bit line.

Also, when the data corresponding to the leakage bit lines are program-inhibit data "1," program-inhibit data "1" are programmed, and thus programming and reading operations are performed normally. When the data corresponding to the leakage bit lines are programming data "0," program-inhibit data "1" are programmed. Therefore, it is understood that when data corresponding to one leakage bit line is programming data "0," the corresponding writing data WR-data programmed in the flash memory device 200 will include one error bit. Accordingly, although the programming operation is performed by modifying the writing data WR-data corresponding to the leakage bit line to be program-inhibit data "1," the original writing data WR-data may be recovered by the error correcting circuit 140.

Figure 4:
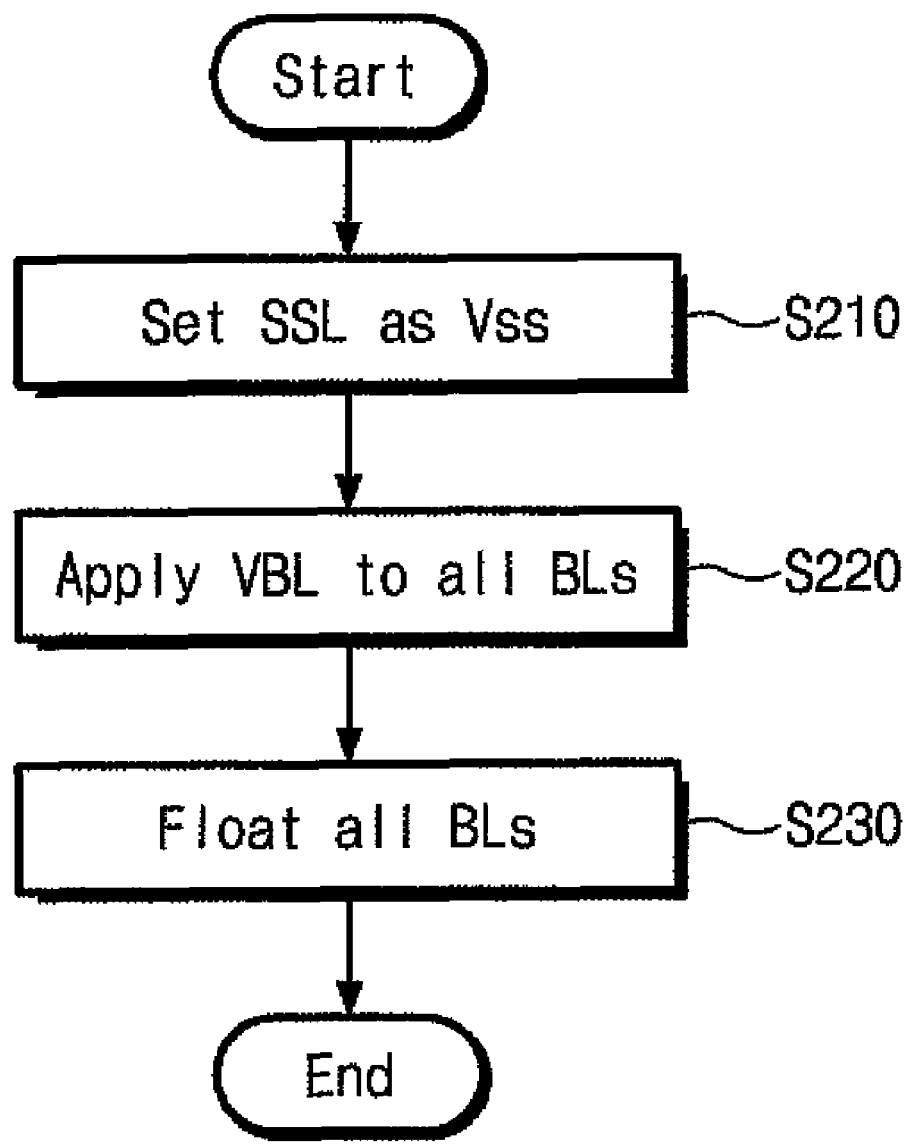
FIG. 4 is a flowchart illustrating a method for detecting a leakage bit lines in the memory system, according to an embodiment of the present invention.

FIG. 4 is a flowchart illustrating a method for detecting leakage bit lines in the memory system 10, according to an illustrative embodiment of the present invention. Referring to FIGS. 1, 2 and 4, in operation S210, the control logic 250 controls the row decoder 220 in order for ground voltage Vss to be applied to the string selection line SSL of the memory cell array 210, under control of the bit line leakage controller 260. When the ground voltage Vss is applied to the string selection line SSL, all the string selection transistors SST are turned off.

In operation S220, the control logic 250 controls the page buffer unit 230 in order for a bit line voltage VBL to be applied to all the bit lines BL0 to BL3, under control of the bit line leakage controller 260. The bit line voltage VBL is higher than the ground voltage Vss. For example, the bit line voltage VBL may be a power supply voltage Vcc.

In operation S230, the control logic 250 controls the page buffer unit 230 in order for all the bit lines BL0 to BL3 to be floated, under control of the bit line leakage controller 260. Operation S230 is performed by controlling the page buffer unit 230 to break the electrical connection between the bit lines BL0 to BL3 and the page buffer unit 230.

Since the bit lines BL0 to BL3 have been floated, the voltages of normal bit lines are maintained, while the voltages of the leakage bit lines become lower. After a predetermined time, the bit lines BL0 to BL3 are electrically connected to the page buffer 232. At this point "1" is stored in each latch of the page buffer 232 corresponding to the normal bit lines, and "0" is stored in each latch of the page buffer 232 corresponding to the leakage bit lines. For example, assuming for purposes of discussion that bit lines BL1 and BL3 are the leakage bit lines, data stored in the page buffer 232 are "1010." In this manner, the leakage bit lines BL1 and BL3 of the memory cell array 210 can be detected.

Figure 5:
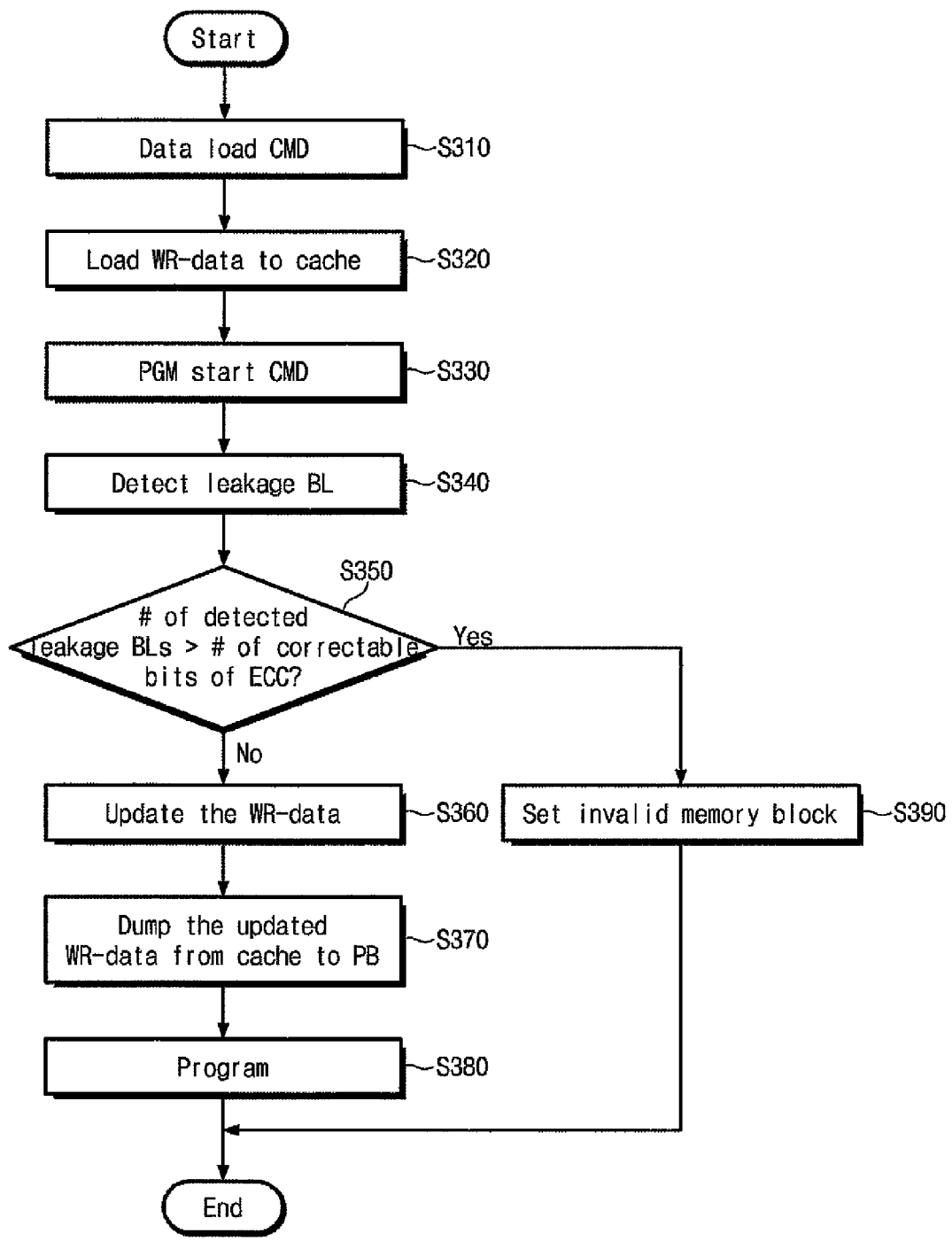
FIG. 5 is a flowchart illustrating an embodiment of a method for operating the memory system, according to an embodiment of the present invention.

FIG. 5 is a flowchart showing a method for operating the memory system 10, according to an illustrative embodiment of the present invention. Referring to FIGS. 1, 2 and 5, when a data load command is transferred to the flash memory device 200 in operation S310, the writing data WR-data are loaded into the cache 234 of the flash memory device 200 in operation S320. For purposes of explanation, it is assumed that the writing data WR-data are "0010." The writing data WR-data may be provided from the memory controller 100, for example.

When the writing data WR-data is loaded, a program start command is transferred to the flash memory device 200 in operation S330. In response, the bit line leakage controller 260 controls the row decoder 220 and the page buffer unit 230 to detect leakage bit lines. Since an illustrative method for detecting the leakage bit lines has been described with reference to FIG. 4, the corresponding description will not be repeated with respect to FIG. 5.

In operation S350, the bit line leakage controller 260 receives information regarding the leakage bit lines from the page buffer 232 through the interface circuit 240. The bit line leakage controller 260 compares the number of leakage bit lines of the memory cell array 210 with the number of bits correctable by the error correcting circuit 140. When the number of the detected leakage bit lines is not greater than the number of correctable bits, operation S360 is performed to update the writing data WR-data.

The bit line leakage controller 260 updates the writing data WR-data in operation S360 so that the writing data WR-data, which correspond to the leakage bit lines, may be modified to be program-inhibit data "1." In the present example, the information regarding the leakage bit lines stored in the page buffer 232 is "1010," and the writing data WR-data stored in the cache 234 are "0010." The bit line leakage controller 260 modifies the data, corresponding to the leakage bit lines BL1 and BL3, among the writing data WR-data stored in the cache 234 to be program-inhibit data "1." That is, the writing data WR-data stored in the cache 234 are updated from "0010" to "0111."

A general programming operation of the flash memory device 200 is then performed. In operation S370, the updated writing data WR-data are dumped into the page buffer 232 from the cache 234, such that the page buffer 232 stores the updated writing data "0111." In operation S380, a programming operation is performed on the flash memory device 200, and thus "0111" are programmed in a selected page of the memory cell array 210.

As a result, the original writing data WR-data are "0010," but the data programmed in the memory cell array 210 are "0111." In operation S350, it is assumed that a two-bit error can be recovered by the error correcting circuit 140. In a subsequent reading operation, since errors are corrected by the error correcting circuit 140, the data programmed in the memory cell array 210 are corrected, so that the original writing data WR-data "0010" is read out.

Retuning to operation S350, when the number of the detected leakage bit lines is greater than the number of the bits correctable by the error correcting circuit 140, operation S390 is performed. In operation S390, the memory blocks connected to the detected leakage bit lines are identified as invalid memory blocks.

Accordingly, when the number of the leakage bit lines of the memory cell array 210 is not greater than the number of the bits correctable by the error correcting circuit 140, the method for operating the memory system 10 prevents memory blocks from being processed as invalid memory blocks, due to leakage bit lines, thereby enhancing yield.

Figure 6:
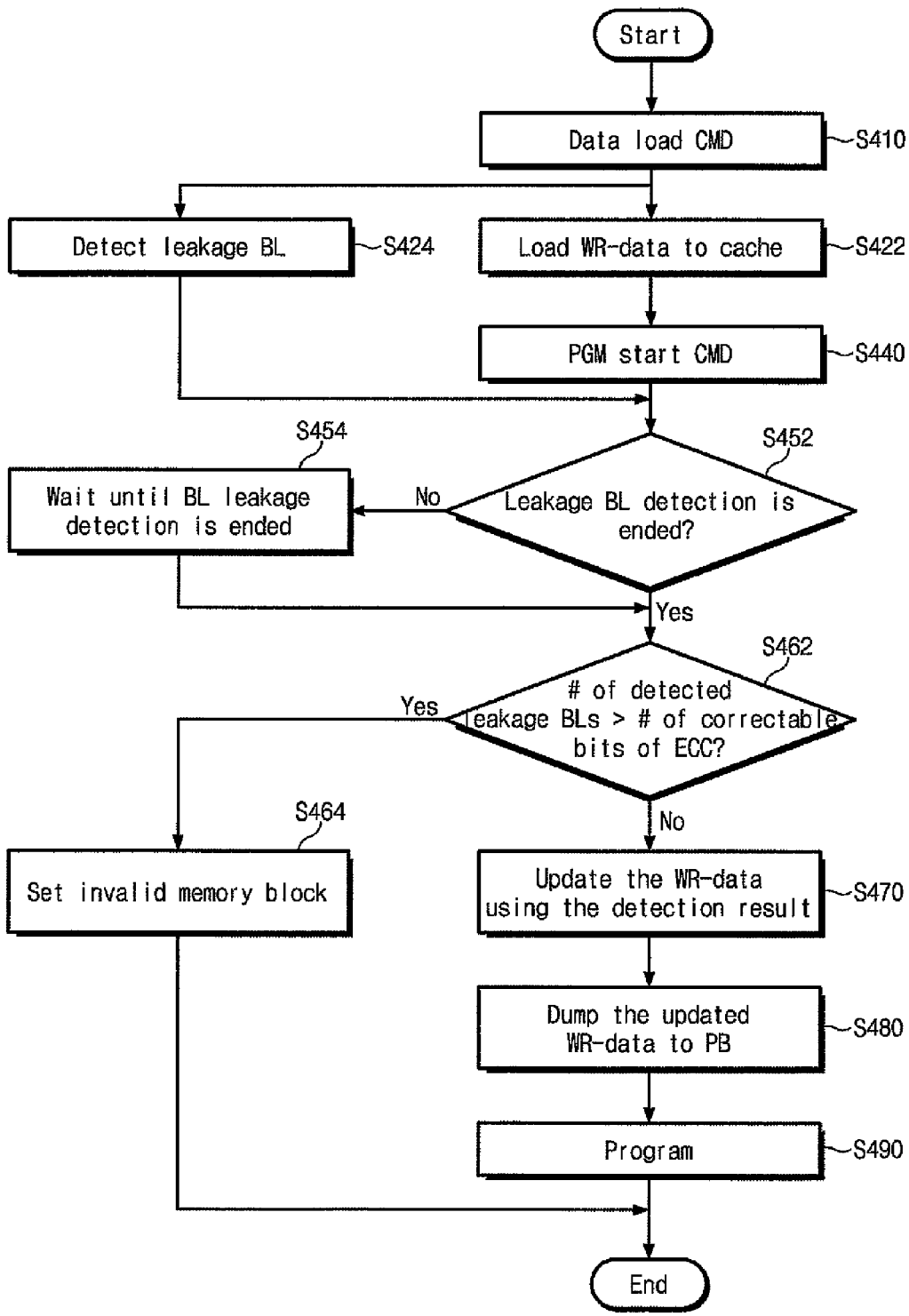
FIG. 6 is a flowchart illustrating another embodiment of a method for operating the memory system, according to an embodiment of the present invention.

FIG. 6 is a flowchart showing a method for operating the memory system 10, according to another illustrative embodiment of the present invention. Referring to FIGS. 1, 2 and 6, a data load command is transferred to the flash memory device 200 in operation S410, and operations S422 and S424 are performed m response.

In operation S424, leakage bit lines BL are detected. Since an illustrative method for detecting the leakage bit lines has been described with reference to FIG. 4, the corresponding description will not be repeated with respect to FIG. 5. The bit line leakage controller 260 controls the row decoder 220 and the page buffer unit 230 to store information regarding the leakage bit lines in the page buffer 232.

In operation S422, the writing data WR-data are loaded into the cache 234. The writing data WR-data is provided from the memory controller 100, for example. Since the information regarding the leakage bit lines is stored in the page buffer 232 and the writing data WR-data are stored in the cache 234, operations S422 and S424 may be performed simultaneously.

When the writing data WR-data is loaded, a program start command is sent to the flash memory device 200 in operation S440. However, when there is a relatively small amount of the writing data WR-data, the loading of the writing data WR-data in operation S422 may end before the detection of the leakage bit lines is completed in operation S424. That is, the program start command may be sent to the flash memory device 200, even though the bit line leakage controller 260 is still controlling the row decoder 220 and the page buffer unit 230 to store the information regarding the leakage bit lines in the page buffer 232.

Therefore, when the program start command is sent to the flash memory device 200, since the page buffer 232 may be in use, the bit line leakage controller 260 determines in operation S452 whether the operation for detecting the leakage bit lines has ended. When the operation for detecting the leakage bit lines has not ended, the programming operation is not yet performed and the process awaits completion of the operation for detecting the leakage bit lines in operation S454. When the operation for detecting the leakage bit lines ends, operation S462 is performed.

In operation S462, the bit line leakage controller 260 determines whether the number of the detected leakage bit lines is greater than the number of bits correctable by the error correcting circuit 140. When the number of the detected leakage bit lines is not greater than the number of bits correctable by the error correcting circuit 140, operation S470 is performed.

In operation S470, the writing data WR-data are updated, so that data corresponding to the leakage bit lines are modified to be program-inhibit data "1." For example, again assuming that the writing data WR-data are "0010" and the information regarding the leakage bit lines is "1010" (indicating that bit lines BL1 and BL are leakage bit lines), the writing data WR-data are updated to "0111." In operation S480, the updated writing data WR-data "0111" are dumped into the page buffer 232.

In operation S490, a programming operation is performed on the flash memory device 200. That is, the updated writing data WR-data "0111" are programmed in the memory cell array 210. When the programming operation of the updated writing data WR-data "0111" is performed, updated writing data WR-data to be programmed in a subsequent cycle may be loaded into the cache 234. That is, the page buffer 232 and the cache 234 of the page buffer unit 230 perform a cache-programming operation.

When it is determined at operation S462 that the number of the detected leakage bit lines is greater than the number of the bits correctable by the error correcting circuit 140, the memory blocks connected to the detected leakage bit lines are identified as the invalid memory blocks in operation S464.

As described above, the memory system 10 in an embodiment of the present invention receives writing data WR-data, detects leakage bit lines, updates the writing data WR-data by modifying data corresponding to the detected leakage bit lines to be program-inhibit data, and performs a programming operation of the updated writing data WR-data. Accordingly, the memory system 10 prevents occurrence of invalid memory blocks due to the leakage bit lines.

Moreover, the memory system 10 according to an embodiment of the present invention simultaneously performs operations for detecting leakage bit lines and loading writing data WR-data. Accordingly, the programming time of the flash memory device 200 is shortened.

The flash memory device 200 according to an embodiment of the present invention has been described with reference to a NAND flash memory device. However, it will be understood that the memory system 10 according to other various embodiments of the present invention is not limited to a NAND flash memory device.

Further, embodiments of the present invention have been described for detecting leakage bit lines using page buffer 232, and for loading writing data WR-data using cache 234. However, it will be understood that operations for detecting leakage bit lines and loading the writing data WR-data are not limited to this configuration. For example, in alternative embodiments, the operation for detecting leakage bit lines may be performed using the cache 234, and the operation for loading writing data WR-data may be performed using page the buffer 232.

In the above-described embodiments, the control logic 250 and the bit line leakage controller 260 have been described as separate elements. However, the configuration of the control logic 250 and the bit line leakage controller 260 are not limited. For example, in alternative embodiments, the control logic 250 and the bit line leakage controller 260 may be integrated as one element.

Figure 7:
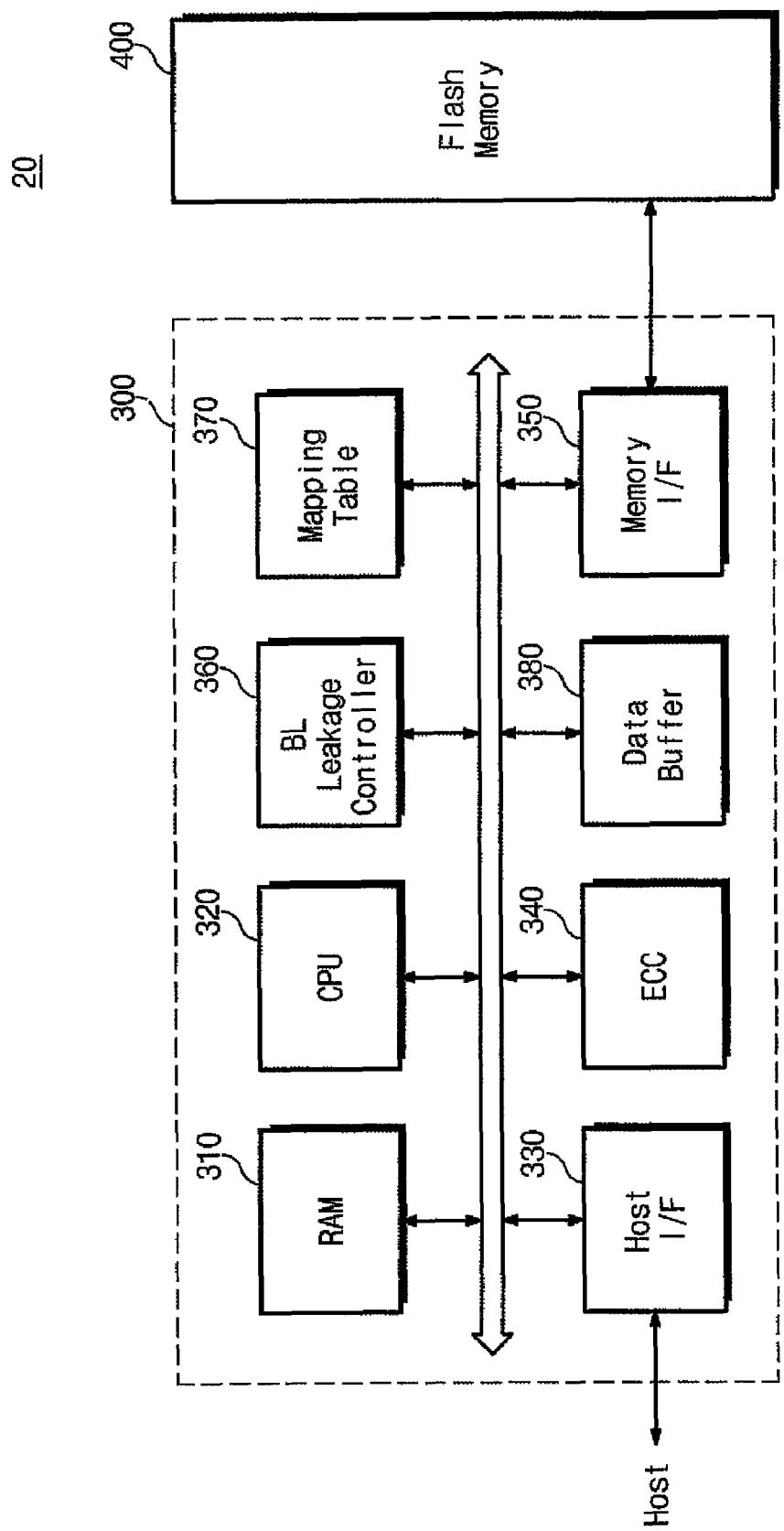
FIG. 7 is a block diagram of a memory system, according to an embodiment of the present invention.

FIG. 7 is a block diagram of a memory system 20, according to another illustrative embodiment of the present invention. Referring to FIG. 7, the memory system 20 includes a memory controller 300 and a flash memory device 400.

The memory controller 300 is connected to a host and the flash memory device 400. The memory controller 300 transfers data read from the flash memory device 400 to the host, and/or stores data transferred from the host in the flash memory device 400. The flash memory device 400 is described in more detail with reference to FIG. 8, below.

The memory controller 300 includes RAM 310, processing unit 320, host interface 330, error correcting circuit 340, memory interface 350, bit line leakage controller 360, mapping table 370, and data buffer 380. RAM 310 may be used as operational memory of the processing unit 320, which controls operation of the memory controller 300 and which may be a CPU. The host interface 330 may include a protocol for exchanging data between the host and the memory controller 300. For example, the memory controller 300 may be configured to communicate with an external device (host) through any one of various interface protocols, such as USB, MMC, PCI-E, ATA, Serial-ATA, Parallel-ATA, SCSI, ESDI and IDE.

The error correcting circuit 340 detects and corrects errors in data read from the flash memory device 400. The memory interface 350 interfaces with the flash memory device 400.

The bit line leakage controller 360 updates writing data WR-data stored in the data buffer 380 using leakage bit line information stored in the mapping table 370, providing information about leakage bit lines in the flash memory device 400. The bit line leakage controller 360 updates the writing data WR-data so that data corresponding to the leakage bit lines are modified to be program-inhibit data "1."

In FIG. 7, the bit line leakage controller 360 has been illustrated as a discrete block separate from the processing unit 320. However, it will be understood that operations performed by the bit line leakage controller 360 may be performed by the processing unit 320, in various embodiments.

During a programming operation, when a program fail occurs, the bit line leakage controller 360 detects leakage bit lines of the flash memory device 400. An operation for detecting the leakage bit lines will be described in more detail with reference to FIG. 10, according to an embodiment of the present invention. The bit line leakage controller 360 compares the detected leakage bit lines with the leakage bit lines identified by the leakage bit information. When the detected leakage bit lines are the same as the leakage bit lines identified by the leakage bit line information, the bit line leakage controller 360 modifies the memory block, corresponding to a page where the program fail occurred, as an invalid memory block.

The bit line leakage controller 360 compares the number of detected leakage bit lines with the number of error bits correctable by the error correcting circuit 340. When the number of the detected leakage bit lines is greater than the number of the bits correctable by the error correcting circuit 340, the bit line leakage controller 360 modifies memory blocks connected to the detected leakage bit lines as invalid memory blocks.

When the detected leakage bit lines differ from the leakage bit lines identified by the leakage bit line information, and the number of the detected leakage bit lines is less than the number of the bits correctable by the error correcting circuit 340, the bit line leakage controller 360 updates the leakage bit line information stored in the mapping table 370 to include information about the detected leakage bit lines.

In addition to storing leakage bit line information, the mapping table 370 may also store information about the invalid memory blocks of the flash memory device 400. The data buffer 380 operates as a buffer between the host and the flash memory device 400. For example, the data buffer 380 may store the writing data WR-data to be programmed in the flash memory device 400. The data buffer 380 also stores data read from the flash memory device 400.

Figure 8:
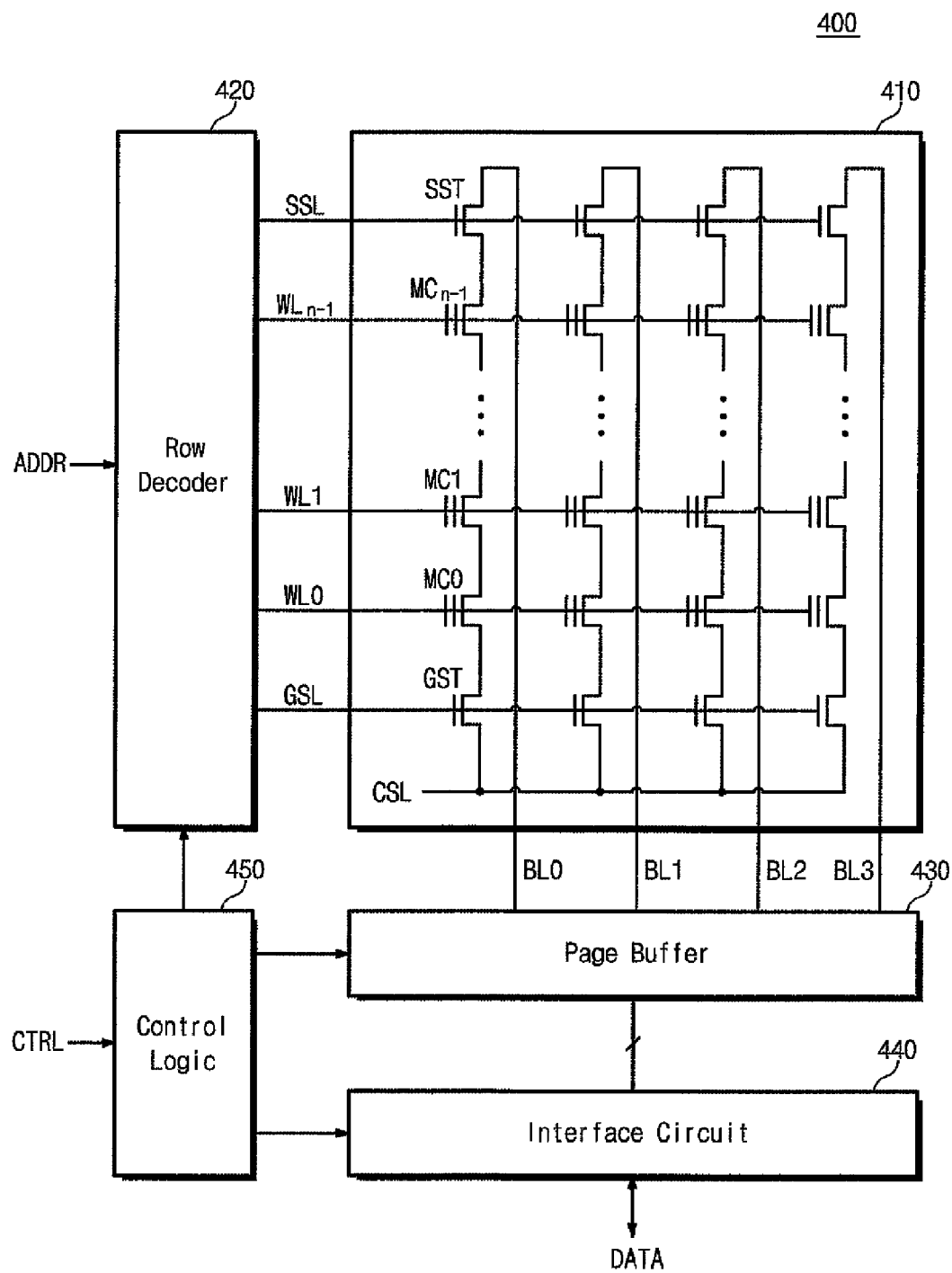
FIG. 8 is a block diagram of a flash memory device of FIG. 7, according to an embodiment of the present invention.

FIG. 8 is a block diagram of the flash memory device 400 of FIG. 7, according to an illustrative embodiment of the present invention. Referring to FIG. 8, the flash memory device 400 includes memory cell array 410, row decoder 420, page buffer 430, interface circuit 440 and control logic 450.

The memory cell array 410 includes multiple memory blocks, although FIG. 4 illustrates only one representative memory block for purposes of description. Each memory block includes multiple bit lines, such as 1024 or 2048 bit lines, for example. For convenience, FIG. 8 shows only four representative bit lines BL0 to BL3 to indicate the multiple bit lines.

The representative bit lines BL0 to BL3 extend from a corresponding memory block, and can be connected in common to multiple memory blocks. For example, all the memory blocks of the memory cell array 410 may be connected to the bit lines BL0 to BL3.

A string selection transistor SST, memory cells MC0 to $MC_{n-1}$, and a ground selection transistor GST are connected between each bit line BL0 to BL3 and a common source line CSL. The gate of the string selection transistor SST is connected to the row decoder 420 through string selection line SSL. The gates of the memory cells MC0 to $MC_{n-1}$ are connected to the row decoder 420 through respective corresponding word lines WL0 to $WL_{n-1}$. The gate of the ground selection transistor GST is connected to the row decoder 420 through ground selection line GSL. Each set of memory cells MC connected to one word line WL constitute one page.

The row decoder 420 is connected to the memory cell array 410 and the control logic 450. The row decoder 420 receives an address ADDR, and selects word lines WL0 to $WL_{n-1}$ of the memory cell array 410 under control of the control logic 450. The address ADDR transferred to the row decoder 420 may be provided from the memory controller 300 of FIG. 7, for example.

The page buffer 430 is connected to the memory cell array 410, the interface circuit 440 and the control logic 450. The page buffer 430 reads data stored in the memory cell array 410 and/or stores data to be written in the memory cell array 410, under control of the control logic 450. The page buffer 430 also exchanges data with the interface circuit 440 under control of the control logic 450. The page buffer 430 may be configured with multiple latches, for example, corresponding to the bit lines BL0 to BL3.

The interface circuit 440 exchanges data with the page buffer 430. The interface circuit 440 may be connected to and exchange data with the memory controller 300 of FIG. 7, for example. The interface circuit 440 may include a column selector for selecting the bit lines BL0 to BL3 of the memory cell array 410, and a data input/output circuit (not shown).

The control logic 450 is connected to the row decoder 420, the page buffer 430 and the interface circuit 440. The control logic 450 controls operation of the flash memory device 400 according to a control signal CTRL. The control signal CTRL may be provided from the memory controller 300 of FIG. 7, for example. That is, the control logic 450 may control the flash memory device 400 under control of the bit line leakage controller 360 of the memory controller 300.

Hereinafter, operation of the memory system 20 according to an illustrative embodiment of the present invention will be described in more detail with reference to the accompanying drawings.

Figure 9:
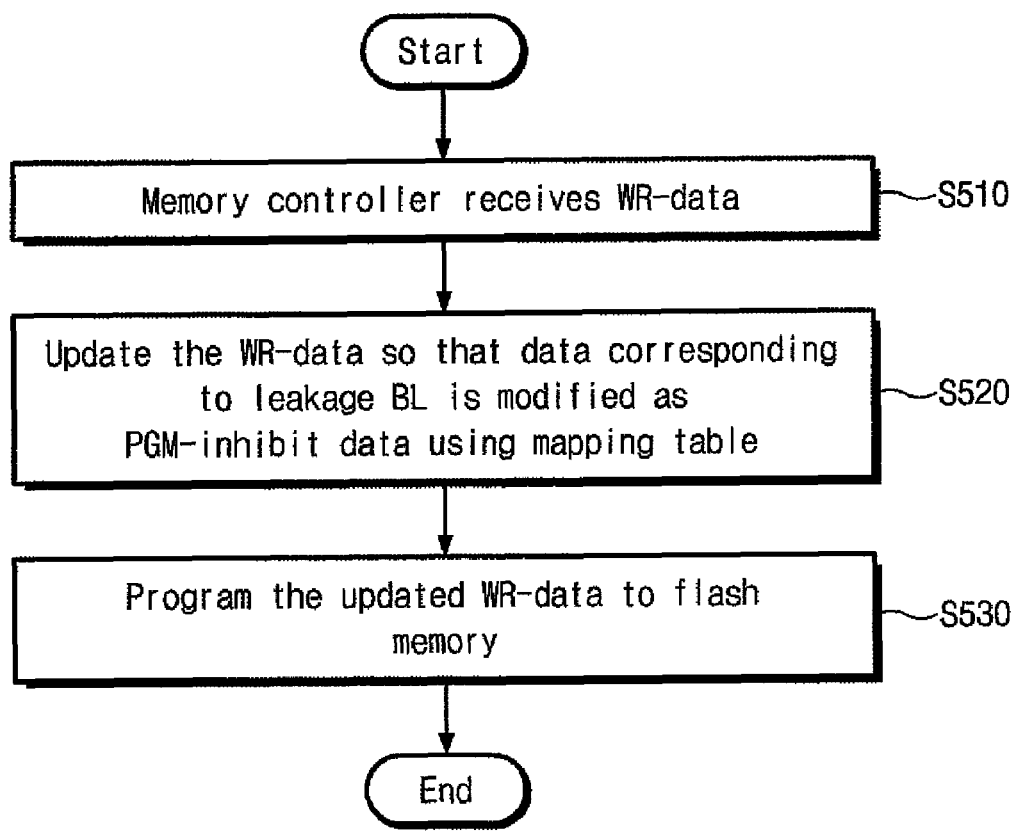
FIG. 9 is a flowchart illustrating a method for operating the memory system, according to an embodiment of the present invention.

FIG. 9 is a flowchart showing a method for operating the memory system 20, according to an illustrative embodiment of the present invention. Referring to FIGS. 7 to 9, in operation S510, the memory controller 300 receives the writing data WR-data, which may be provided from the host.

In operation S520, the writing data WR-data are updated so that data corresponding to leakage bit lines, identified by leakage bit line information stored in the mapping table 370, are modified as program-inhibit data. The bit line leakage information provides information identifying leakage bit lines among the bit lines BL0 to BL3 of the flash memory device 400. For example, assuming "0" is programming data and "1" is program-inhibit data, all data of the writing data WR-data that corresponds to the leakage bit lines, indicated by the stored bit line leakage information, are modified to be program-inhibit data "1."

In operation S530, the updated writing data WR-data are programmed in the flash memory device 400. That is, among the writing data WR-data received in operation S510, the data corresponding to the leakage bit lines are modified to be program-inhibit data, and a programming operation is performed.

When a memory cell connected to a leakage bit line is programmed to programming data "0," a program loop is repeated until current flow does not occur during a test operation. However, during the test operation, current flow always occurs in leakage bit lines due to leakage. Accordingly, although a preset program loop is completely performed, it may be determined during the test operation that the programming of the memory cell connected to a leakage bit line has not ended, and a corresponding memory block is then processed as an invalid memory block. When all the memory blocks of the flash memory device 400 use the bit lines in common, all the memory blocks of the flash memory device 400 may likewise be processed as the invalid memory blocks.

In contrast, when a memory cell connected to a leakage bit line is programmed to program-inhibit data "1," it is determined that a corresponding memory block operates normally when current flow occurs in the leakage bit line during the test operation. Accordingly, when the data corresponding to the leakage bit line are modified to be program-inhibit data "1," the memory blocks connected to the leakage bit line may not be processed as invalid memory blocks due to a leakage bit line.

When the data corresponding to a leakage bit line among the writing data WR-data are program-inhibit data "1," programming and reading operations can be performed normally. However, when the data corresponding to the leakage bit line are programming data "0," the data is modified so that program-inhibit data "1" is programmed. Therefore, when there exists one leakage bit line in the flash memory device 400, it is expected that the writing data WR-data programmed in the flash memory device 400 will include one error bit. Although the programming operation is performed by modifying the writing data WR-data corresponding to the leakage bit line as program-inhibit data "1," original writing data WR-data may still be recovered by the error correcting circuit 340.

Figure 10:
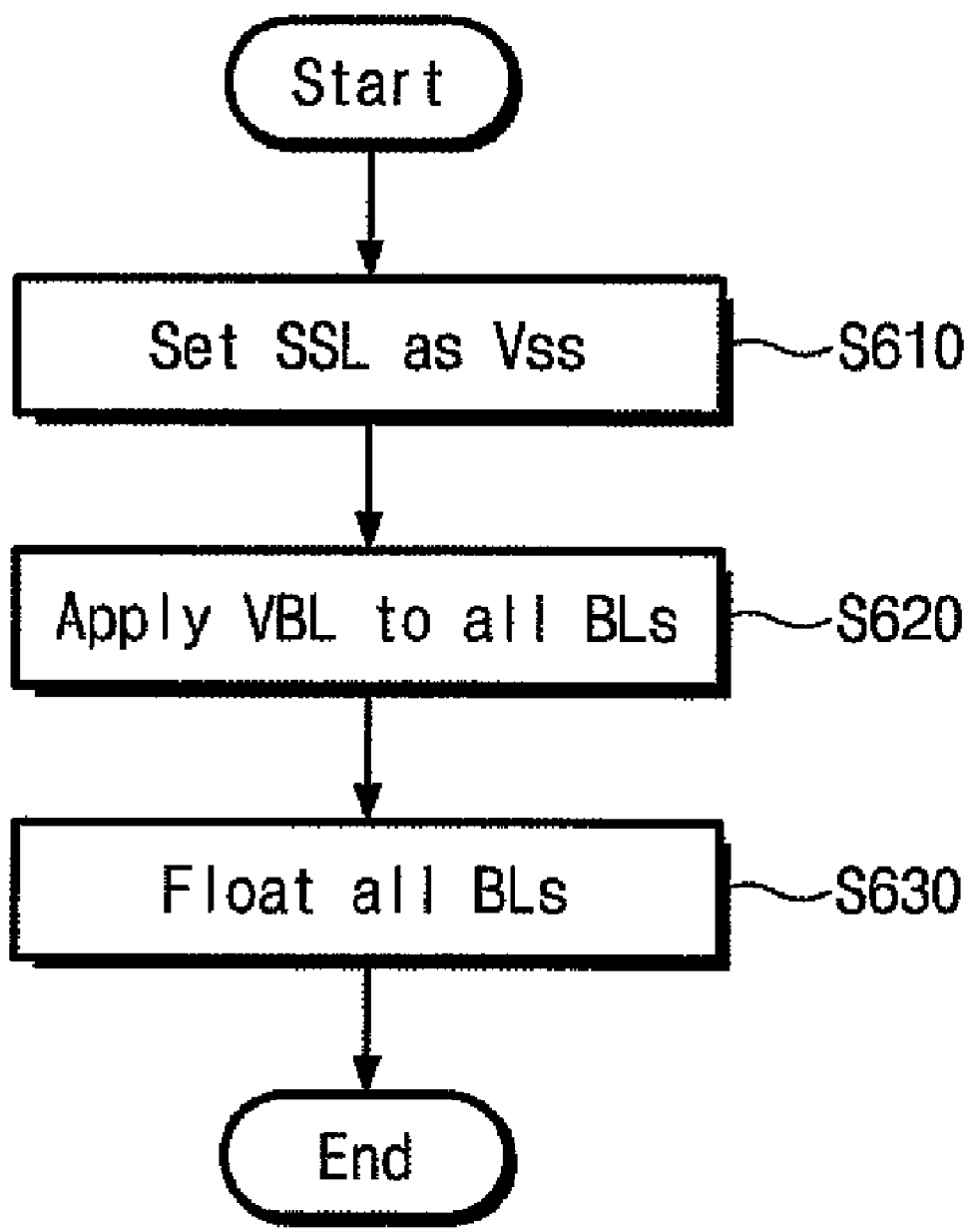
FIG. 10 is a flowchart illustrating a method for detecting leakage bit lines in the memory system, according to an embodiment of the present invention.

FIG. 10 is a flowchart showing a method for detecting leakage bit lines in the memory system 20, according to an illustrative embodiment of the present invention. Referring to FIGS. 7, 8 and 10, in operation S610, the control logic 450 controls the row decoder 420 to apply ground voltage Vss to the string selection line SSL of the memory cell array 410 under control of the bit line leakage controller 360. When the ground voltage Vss is applied to the string selection line SSL, all the string selection transistors SST are turned off.

In operation S620, the control logic 450 controls the page buffer 430 to apply bit line voltage VBL to all the bit lines BL0 to BL3. The bit line voltage VBL is higher than the ground voltage Vss. For example, the bit line voltage VBL may be power supply voltage Vcc.

In operation S630, the control logic 450 controls the page buffer 430 to float all the bit lines BL0 to BL3. That is, in operation S630, electrical connections between the page buffer 430 and the bit lines BL0 to BL3 may be broken.

Since the bit lines BL0 to BL3 have been floated, the voltages of the normal bit lines are maintained, while the voltages of the leakage bit lines become lower. After a predetermined time, the control logic 450 electrically connects the bit lines BL0 to BL3 to the page buffer 430. At this point, "1" is stored in the latches of the page buffer 430 corresponding to the normal bit lines, and "0" is stored in the latches of the page buffer 430 corresponding to the leakage bit lines. For example, assuming that the bit lines BL1 and BL3 are leakage bit lines, data stored in the page buffer 430 are "1010." In this manner, the leakage bit lines BL1 and BL3 of the memory cell array 410 can be detected.

Figure 11:
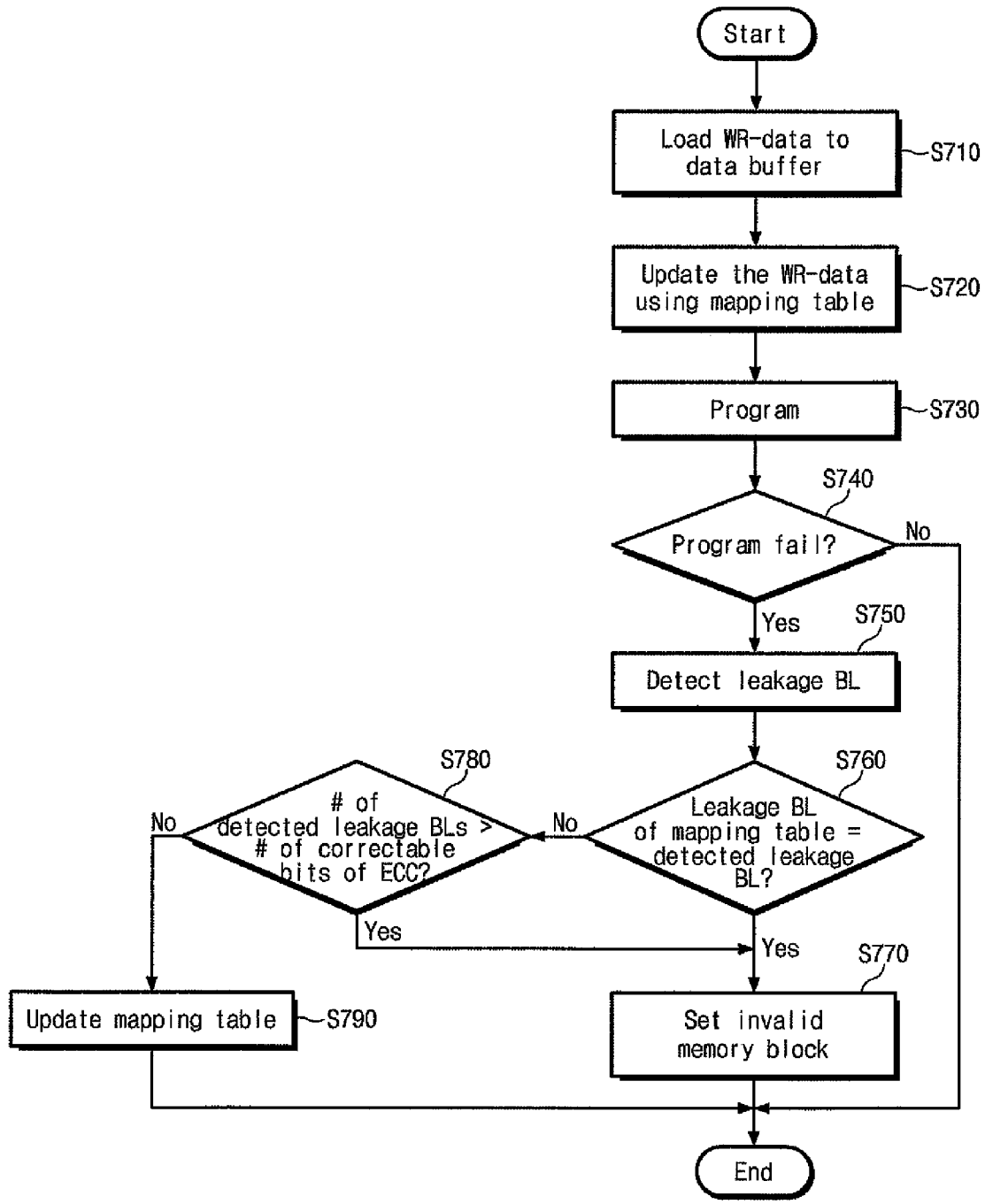
FIG. 11 is a flowchart illustrating an embodiment of a method for operating the memory system, according to an embodiment of the present invention.

FIG. 11 is a flowchart showing an embodiment of a method for operating the memory system 20, according to an illustrative embodiment of the present invention. Referring to FIGS. 7, 8 and 11, in operation S710, writing data WR-data are loaded into the data buffer 380 of the memory controller 300. The writing data WR-data may be provided from the host. For purposes of discussion, it is assumed that the writing data WR-data is "0010," for example.

In operation S720, the bit line leakage controller 360 updates the writing data WR-data stored in the data buffer 380 using the leakage bit line information stored in the mapping table 370 to identify leakage bit lines. The bit line leakage controller 360 updates the writing data WR-data so that data corresponding to the leakage bit lines identified by the leakage bit line information may be modified to be program-inhibit data "1." For example, when the leakage bit line information is "1010" with respect to bit lines BL0 to BL3, indicating that bit lines BL1 and BL3 are leakage bit lines, the writing data WR-data are updated to "0111."

In operation S730, a programming operation of the flash memory device 400 is performed using the updated writing data. For example, "0111" are programmed in the corresponding page of the flash memory device 400. Although the original writing data WR-data are "0010," the data programmed in the memory cell array 410 are "0111." During a subsequent read operation, since errors are corrected by the error correcting circuit 340, "0010" will be read as the original writing data WR-data.

In operation S740, the bit line leakage controller 360 determines whether a program fail occurs during the programming operation of operation S730. When it is determined that a program fail has not occurred, the programming operation ends. When it is determined that a program fail has occurred, operation S750 is performed. In operation S750, the bit line leakage controller 360 detects the leakage bit lines of the flash memory device 400. Since an illustrative method for detecting the leakage bit lines has been described with reference to FIG. 10, the corresponding description will not be repeated with respect to FIG. 11.

In operation S760, the bit line leakage controller 360 determines whether the detected leakage bit lines detected in operation S750 are the same as the leakage bit lines indicated by the leakage bit line information stored in the mapping table 370. When the detected leakage bit lines are the same, it is determined that the program fail occurring in operation S740 was not caused by the leakage bit lines.

For example, in operation S720, the data corresponding to the leakage bit lines indicated by the stored leakage bit line information has been updated as the program-inhibit data "1." Thus, a program fail due to a priori leakage bit lines does not occur. The program fail of operation S740 therefore occurs as a result of a new leakage bit line or a cause other than leakage bit lines. A new leakage bit line can be detected in operation S750. However, when a program fail occurs in operation S740 and a new leakage bit line is not detected in operation S750, the cause of the program fail may be another cause other than the leakage bit line. Accordingly, in operation S770, the memory block corresponding to a page in which the program fail occurs is identified as an invalid memory block.

When the detected leakage bit lines differ from the leakage bit lines indicated by the leakage bit line information, the program fail occurring in operation S740 may be caused by the leakage bit lines. Therefore, when the detected leakage bit lines differ from the leakage bit lines indicated by the leakage bit line information, operation S780 is performed.

In operation S780, the bit line leakage controller 360 determines whether the number of detected leakage bit lines is greater than the number of error bits correctable by the error correcting circuit 340. When the number of detected leakage bit lines is greater than the number of error bits correctable by the error correcting circuit 340, and when the data corresponding to the leakage bit lines are modified as program-inhibit data "1" and programmed, the data written in a corresponding page include error bits greater than the number of bits correctable by the error correcting circuit 340. Accordingly, since the original writing data WR-data "0010" cannot be recovered in the reading operation, the memory blocks connected to the detected leakage bit lines are identified as the invalid memory blocks in operation S770. When the number of detected leakage bit lines is less than the number of error bits correctable by the error correcting circuit 340, operation S790 is performed.

In operation S790, the bit line leakage controller 360 updates the leakage bit line information with information regarding the detected leakage bit lines. The updated information of the leakage bit lines will be used for a subsequent programming operation. Meanwhile, it has been determined in operation S760 that a new leakage bit line exists, and it has been determined in operation S780 that the detected leakage bit lines can be recovered by the error correcting circuit 340.

According to an embodiment of the present invention, the data among the writing data WR-data corresponding to leakage bit lines are modified to be program-inhibit data "1," using stored leakage bit line information. When a program fail occurs during a programming operation, the memory system 20 determines whether the program fail was a result of a new detected leakage bit line, and whether the leakage bit lines can be recovered by error correcting circuit 340. When a new leakage bit line exists and the leakage bit lines can be recovered by the error correcting circuit 340, the memory system 20 updates the leakage bit line information using information regarding the detected leakage bit lines. That is, embodiments of the present invention prevent memory blocks from being processed as invalid memory blocks due to leakage bit lines, thus enhancing yield.

Figure 12:
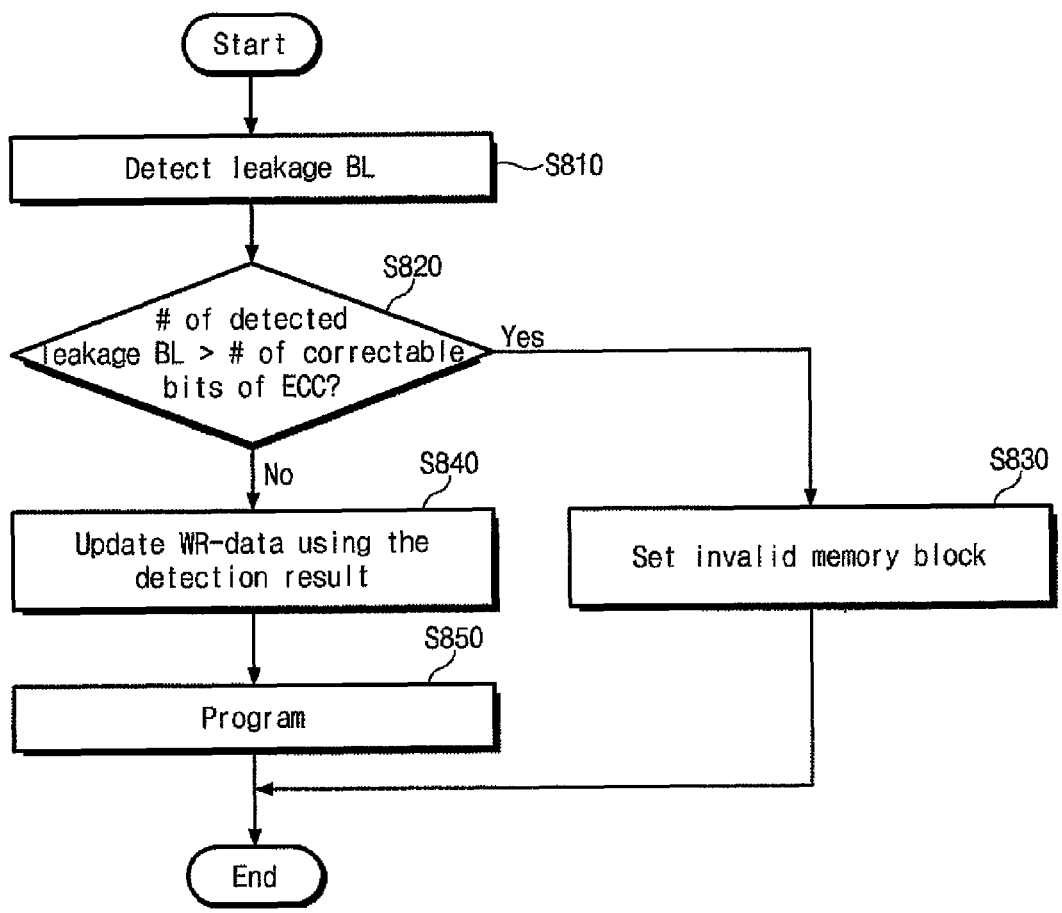
FIG. 12 is a flowchart illustrating another embodiment of a method for operating the memory system, according to an embodiment of the present invention.

FIG. 12 is a flowchart showing a method for operating the memory system 20, according to an illustrative embodiment of the present invention. Referring to FIGS. 7, 8 and 12, in operation S810, the bit line leakage controller 360 controls the row decoder 420 and the page buffer 430 to detect leakage bit lines of the memory cell array 410. Since an illustrative method for detecting the leakage bit lines has been described with reference to FIG. 10, the corresponding description will not be repeated with respect to FIG. 12.

In operation S820, the bit line leakage controller 360 determines whether the number of detected leakage bit lines is greater than the number of error bits correctable by the error correcting circuit 340. When the number of detected leakage bit lines is determined to be greater than the number of error bits correctable by the error correcting circuit 340, the memory blocks connected to the detected leakage bit lines are identified as invalid memory blocks in operation S830. When the number of detected leakage bit lines is determined to be less than the number of error bits correctable by the error correcting circuit 340, operation S840 is performed.

In operation S840, the bit line leakage controller 440 updates the writing data WR-data in order for data corresponding to the detected leakage bit lines among the writing data WR-data to be modified as program-inhibit data "1." Subsequently, a programming operation is performed using the updated writing data WR-data in operation S850. When a program fail occurs in operation S850, a memory block corresponding to a page where the program fail occurs can be identified as an invalid memory block.

According to an embodiment of the present invention, data corresponding to the leakage bit lines among the writing data WR-data are modified as program-inhibit data "1." Accordingly, the memory blocks may be prevented from being processed as invalid memory blocks due to the leakage bit lines, thus enhancing yield.

The memory system 20 according to embodiments of the present invention has been described with reference to a NAND flash memory device. However, it will be understood that the memory system according to various embodiments of the present invention is not limited to a NAND flash memory device.

In the above-described embodiments, the bit line leakage controller 360 has been described separately from the processing unit 320. However, it will be understood that the operations of the bit line leakage controller 360 may be performed by the processing unit 320, in various embodiments.

Figure 13:
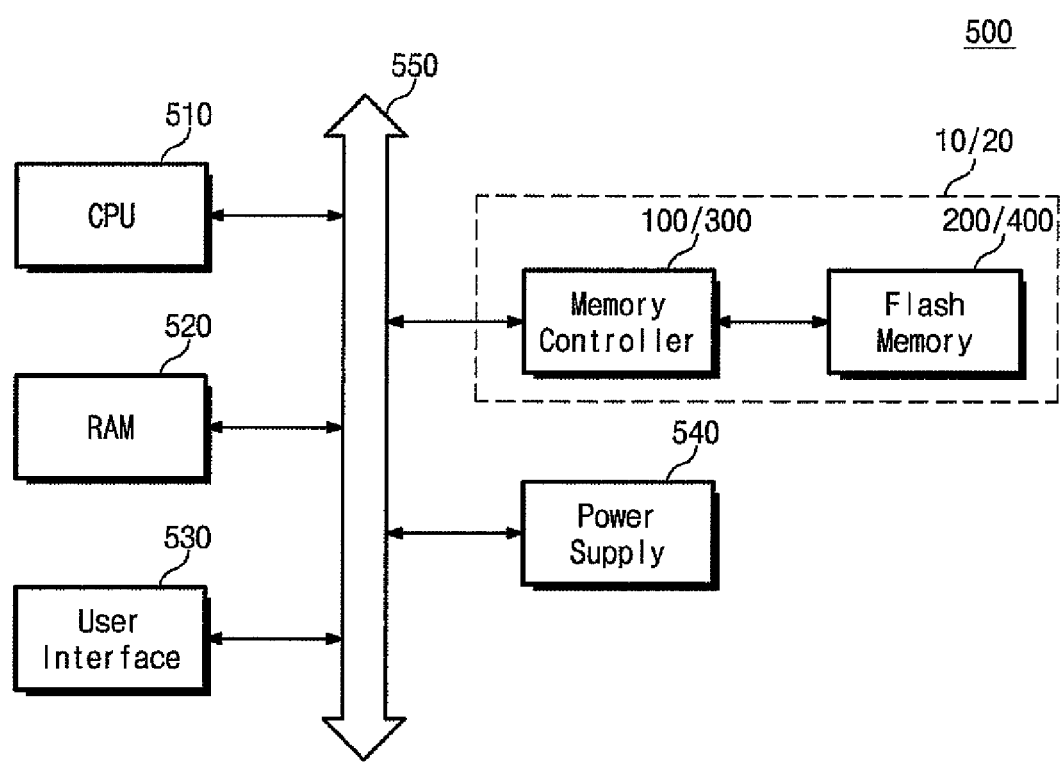
FIG. 13 is a block diagram of a computing system including the memory system, according to embodiments of the present invention.

FIG. 13 is a block diagram of a computing system 500, including the memory system 10/20, according to illustrative embodiments of the present invention. Referring to FIG. 13, the computing system 500 includes central processing unit (CPU) 510, RAM 520, user interface 530, power supply 540 and the memory system 10/20, according to embodiments of the present invention.

The memory system 10/20 includes memory controller 100/300 and flash memory device 200/400, according to embodiments of the present invention. The memory system 10/20 is electrically connected to the CPU 510, the RAM 520, the user interface 530 and the power supply 540 through system bus 550. Data provided through the user interface 530 or processed by the CPU 510 is stored in the flash memory device 200/400 through the memory controller 100/300.

When the memory system 10/20 is mounted as a semiconductor disk device (SSD), the booting speed of the computing system may greatly increase. Although not shown, it will be understood that the computing system according to an embodiment of the present invention can further include an application chipset, a camera image processor and the like.

The memory system according to embodiments of the present invention modifies writing data corresponding to leakage bit lines as program-inhibit data. Accordingly, the memory system prevents invalid memory blocks due to leakage bit lines, thereby enhancing yield.

While the present invention has been shown and described in connection with exemplary embodiments thereof, it will be apparent to those skilled in the art that various modifications can be made without departing from the spirit and scope of the invention as defined by the appended claims.

What is claimed is:

1. A method for programming a flash memory device, the method comprising:
    receiving writing data;
    detecting leakage bit lines of the flash memory device;
    updating the received writing data in order for data corresponding to the leakage bit lines to be modified as program-inhibit data; and
    performing a programming operation on the flash memory device after updating the writing data.

2. The method of claim 1, wherein detecting the leakage bit lines comprises:
    applying a ground voltage to a string selection line of the flash memory device;
    applying a bit line voltage to bit lines of the flash memory device; and
    floating the bit lines.

3. The method of claim 1, wherein receiving the writing data and detecting the leakage bit lines are started simultaneously.

4. The method of claim 1, further comprising:
    receiving writing data to be programmed in a succeeding cycle, wherein performing the programming operation and receiving the writing data to be programmed in the succeeding cycle are started simultaneously.

5. The method of claim 1, wherein updating the received writing data comprises:
    determining whether a number of the detected leakage bit lines is greater than a number of bits correctable by an error correcting operation; and
    identifying memory blocks connected to the detected leakage bit lines as invalid memory blocks when the number of the detected leakage bit lines is greater than the number of bits correctable by the error correcting operation.

6. The method of claim 1, further comprising:
    identifying a memory block, corresponding to a page in which a program fail occurs, as an invalid memory block when the program fail occurs in the programming operation.

7. A method for operating a memory system comprising a flash memory device and a memory controller, the method comprising:
    receiving writing data;
    updating the received writing data so that data of the received writing data corresponding to leakage bit lines are modified as program-inhibit data, the leakage bit lines being identified by previously stored leakage bit line information;
    performing a programming operation on the flash memory device using the updated received writing data; and
    detecting leakage bit lines of a memory cell array when a program fail occurs during the programming operation.

8. The method of claim 7, wherein the stored leakage bit line information is stored in a mapping table of the memory controller.

9. The method of claim 7, wherein detecting the leakage bit lines comprises:
    applying a ground voltage to a string selection line of the flash memory device;
    applying a bit line voltage to bit lines of the flash memory device; and
    floating the bit lines.

10. The method of claim 7, further comprising:
    comparing the detected leakage bit lines with the leakage bit lines identified by the stored leakage bit line information; and
    identifying a memory block, corresponding to a page in which the writing data are to be programmed, as an invalid memory block when the detected leakage bit lines are the same as the leakage bit lines identified by the stored leakage bit line information.

11. The method of claim 7, further comprising:
    comparing the detected leakage bit lines with the leakage bit lines identified by the stored leakage bit line information; and
    updating the stored leakage bit line information based on the detected leakage bit lines when the detected leakage bit lines differ from the leakage bit lines identified by the stored leakage bit line information.

12. The method of claim 7, further comprising:
    determining whether a number of the detected leakage bit lines is greater than a number of bits correctable by the memory controller; and
    identifying memory blocks connected to the detected leakage bit lines as invalid memory blocks when the number of the detected leakage bit lines is greater than the number of bits correctable by the memory controller.

13. A memory system, comprising:
    a flash memory device comprising a memory cell array and a bit line leakage controller; and
    a memory controller controlling the flash memory device, the flash memory device and the memory controller receiving external writing data and programming the writing data in the memory cell array,
    wherein the bit line leakage controller modifies data of the received writing data corresponding to leakage bit lines of the memory cell array as program-inhibit data, and
    wherein the bit line leakage controller controls an operation of detecting the leakage bit lines, the operation comprising applying a ground voltage to a string selection line of the memory cell array, applying a bit line voltage to bit lines of the memory cell array, and floating the bit lines to identify the leakage bit lines.

14. The memory system of claim 13, wherein the bit line leakage controller determines whether a number of the detected leakage bit lines is greater than a number of bits correctable by an error correcting operation, and identifies memory blocks connected to the detected leakage bit lines as invalid memory blocks when the number of the detected leakage bit lines is greater than the number of the bits correctable by the error correcting operation.

15. The memory system of claim 13, wherein the flash memory device further comprises:
   a page buffer and a cache, wherein the bit line leakage controller starts the operation of detecting the leakage bit lines using the page buffer when the writing data are loaded into the cache.

16. The memory system of claim 15, wherein the bit line leakage controller updates the writing data in order for the data corresponding to the leakage bit lines of the memory cell array to be modified as the program-inhibit data when loading the writing data ends and the operation of detecting of the leakage bit lines ends.

17. The memory system of claim 13, wherein the memory controller comprises:
   a mapping table storing leakage bit line information representing the leakage bit lines.

18. The memory system of claim 17, wherein the memory controller further comprises:
   a data buffer storing data to be transferred to the flash memory device, wherein the bit line leakage controller updates the writing data in order for the data corresponding to the leakage bit lines, represented by the leakage bit line information, to be modified as the program-inhibit data using the leakage bit line information when the writing data are transferred to the data buffer.

* * * * *